(12) United States Patent
Feil et al.

(10) Patent No.: US 6,444,493 B1
(45) Date of Patent: Sep. 3, 2002

(54) METHOD FOR VERTICALLY INTEGRATING ACTIVE CIRCUIT PLANES AND VERTICALLY INTEGRATED CIRCUIT PRODUCED USING SAID METHOD

(75) Inventors: Michael Feil; Christof Landesberger, both of Munich (DE)

(73) Assignee: Fraunhofer-Gesellschaft zur Foerderung der angewandten Forschung e.V. (DE)

( * ) Notice: Subject to any disclaimer, the term of this patent is extended or adjusted under 35 U.S.C. 154(b) by 0 days.

(21) Appl. No.: 09/857,373
(22) PCT Filed: Dec. 6, 1999
(86) PCT No.: PCT/EP99/09540
§ 371 (c)(1),
(2), (4) Date: Sep. 21, 2001
(87) PCT Pub. No.: WO00/35007
PCT Pub. Date: Jun. 15, 2000

(30) Foreign Application Priority Data

Dec. 8, 1998 (DE) ......................................... 198 56 573

(51) Int. Cl.⁷ .............................................. H01L 21/44
(52) U.S. Cl. ..................... 438/108; 438/107; 438/118; 438/119; 438/455; 438/459
(58) Field of Search ................. 438/107, 108, 438/118, 119, 455, 459, 456

(56) References Cited

U.S. PATENT DOCUMENTS 5,202,754 A    4/1993   Bertin et al.

(List continued on next page.)

FOREIGN PATENT DOCUMENTS

DE    42 38 137 A1    5/1994

(List continued on next page.)

OTHER PUBLICATIONS

Bertin Et Al., "Evaluation Of A Three–Dimensional Memory Cube System," IEEE Transactions On Components, Hybrids, And Manufacturing Technology, IEEE, vol. 16 (No. 8), pp. 1006–1011 (Dec. 1993).

(List continued on next page.)

*Primary Examiner*—Eddie Lee
*Assistant Examiner*—N. Drew Richards
(74) *Attorney, Agent, or Firm*—Patton Boggs LLP

(57) ABSTRACT

In a method for vertically integrating active circuit planes, a first substrate having at least one integrated circuit in a first main surface thereof and further having connecting areas for the integrated circuit as well as outer connecting areas on the first main surface is provided in a first step. A second substrate having at least one integrated circuit in a first main surface thereof and further having connecting areas for the integrated circuit as well as open or openable areas on the first main surface is provided. The first main surfaces of the first and second substrates are joined in such a way that the connecting areas of the first substrate are connected to those of the second substrate in an electrically conductive manner in such a way that the outer connecting areas of the first substrate are in alignment with the open or openable areas of the second substrate. Subsequently, the second substrate is thinned and the outer connecting areas are exposed through the open or openable areas. The resultant chips can be further processed making use of standard methods.

10 Claims, 4 Drawing Sheets

U.S. PATENT DOCUMENTS

| | | |
|---|---|---|
| 5,266,511 A | 11/1993 | Yoshihiro |
| 5,563,084 A | 10/1996 | Ramm et al. |
| 5,656,553 A | 8/1997 | Leas et al. |
| 5,880,010 A * | 3/1999 | Davidson .................... 438/455 |
| 6,080,640 A * | 6/2000 | Gardner et al. ............. 438/455 |
| 6,153,495 A * | 11/2000 | Kub et al. .................. 438/459 |
| 6,287,940 B1 * | 9/2001 | Cole et al. .................. 438/107 |

FOREIGN PATENT DOCUMENTS

| | | |
|---|---|---|
| DE | 44 27 515 C1 | 8/1995 |
| DE | 44 33 845 A1 | 3/1996 |
| DE | 44 33 846 A1 | 3/1996 |
| DE | 195 16 487 C1 | 7/1996 |
| DE | 44 33 833 A1 | 8/1996 |
| EP | 0 890 989 A1 | 1/1999 |
| WO | WO 92/09098 | 5/1992 |
| WO | WO 95/09438 | 4/1995 |

OTHER PUBLICATIONS

Nakanishi Et Al., "Development Of High Density Memory IC Package By Stacking IC Chips," IEEE (Japan), pp. 634–640 (1995).

Massit Et Al., "High Performance 3D MCM Using Silicon Microtechnologies," IEEE (France), pp. 641–644 (1995).

Barrett Et Al., "Performance And Reliability Of A Three–Dimensional Plastic Moulded Vertical Multichip Module (MCM–V)," IEEE (Ireland), pp. 656–663 (1995).

* cited by examiner a)

b)

METHOD FOR VERTICALLY INTEGRATING ACTIVE CIRCUIT PLANES AND VERTICALLY INTEGRATED CIRCUIT PRODUCED USING SAID METHOD

BACKGROUND OF THE INVENTION

1. Field of the Invention

The present invention relates to a method for vertically integrating two active circuit planes. In addition, the present invention relates to vertically integrated circuits produced by means of such methods.

2. Description of Prior Art

Integrated circuits arranged in a substrate are located essentially in the vicinity of a main surface of the substrate. In integrated circuits the active life of the transistors takes place only in the uppermost plane of the substrate, e.g. of the silicon crystal, in a thickness range of less than 2 $\mu$m. The residual, a few hundred microns thick silicon of the substrate is not required for the circuit function. Hence, increasing efforts have been made for some time to utilize the third dimension, i.e. the thickness dimension more effectively.

The production of an integrated circuit e.g. in CMOS technology normally comprises far more than 100 individual process steps; each of these process steps must be mastered separately with a yield of approx. 100% so as to obtain a reasonable yield. Attempts to build up further circuit planes by further processing on existing planes so as to directly integrate an additional circuit plane in this way would mean that twice the number of process steps has to be carried out, whereby the demands on the yield would increase exponentially. Hence, such a utilization of the thickness dimension cannot be realized in a sensible way.

The joining of two wafers which have been: processed independently of one another will, however, only entail a small number of additional steps for the individual wafer. More recent solutions are therefore based on the stacking of fully processed chips, the contacts protruding on one side and being wired together. Such techniques are disclosed e.g. in M. F. Suer, et al: High Density 3D Packaging", Proc. VLSI Packaging Workshop (1991), and C. L. Bertin, et al: "Evaluation of a Three-Dimensional Memory Cube System", IEEE Transactions on Components, Hybrids and Manufacturing Technology, vol. 16(8), p. 1006, (1993). These methods are, however, only suitable for components having a small number of terminals, e.g. for storage components, but not for logic units having a large number of terminals.

Other concepts are based on three-dimensional multichip module techniques (3D-MCM techniques). In the case of these techniques several multichip modules are stacked one on top of the other. This is done in such a way that one or a plurality of chips are mounted on a support so as to define a multichip module in common, whereupon a plurality of supports is joined and wired together. Such techniques are described e.g. in H. Nakanishi, et al: "Development of High Density Memory IC Package by Stacking IC Chips", Proc. IEEE Electronic Components and Technology Conference, p. 634 (1995); C. G. Massit, G. C. Nicolas: "High Performance 3D MCM Using Microtechnologies", Proc. IEEE Electronic Components and Technology Conference, p. 641 (1995); J. Barret, et al: "Performance and Reliability of a Three-Dimensional Plastic Moulded Vertical Multichip Module (MCM-V)", Proc. IEEE Electronic Components and Technology Conference, p. 656 (1995); and they are also described in U.S. Pat. No. 5,202,754.

DE 4433846 A, DE 4433845 A, DE 4433833 A and U.S. Pat. No. 5,563,084 additionally describe vertical integration methods which are based on a so-called interchip-via concept (ICV concept). According to this concept, wafers are first processed by means of standard processes. Then, two wafers are joined, the upper wafer being thinned to a thickness of approx. 10 $\mu$m for the purpose of stacking and being then glued onto the lower wafer. Subsequently, the electric connections between the upper plane and the lower plane are established by means of a trench production method which is normally used in the field of semiconductor technology, but which has been modified. When the ICV concept is used, the active side of the respective wafer is arranged on the top so that the stacking of a plurality of planes is, in principle, possible, but the contacts from one plane to the next must be passed through the wafer. For this through connecting processes are necessary which require temperatures above 400° C. The ICV concept is additionally disadvantageous insofar as auxiliary supports are required for thinning the upper wafer and that complicated rebonding processes have to be carried out consequently.

DE 44 27 515 C1 describes a method for producing a three-dimensional circuit arrangement comprising the steps of glueng a substrate disc, which comprises components in a first main surface thereof, onto a supporting plate, thinning it and dicing it by an etching process, after the application of a photoresist mask, making use of the photoresist mask as an etching mask, so that splintering of the thinned substrate discs is avoided and so that a better utilization of the material is achieved.

DE 42 38 137 A1 describes a method for producing devices with components, which are produced from,various materials.

DE 195 16 487 C1 discloses a method for vertically integrating microelectronic systems in the case of which two substrates are connected front to front. The term front here describes the side of the substrate on which circuit layers and associated metallizations are formed. A first substrate is prepared by forming a viahole therein from the front of the substrate; this viahole fully penetrates at least the circuit layers and it extends through a metallization on the front of the first substrate. Subsequently, the front of the first substrate is joined to the front of a second substrate, the metallization on the front of the first substrate being in alignment with a metallization on the front of the second substrate. After the joining, the aligned metallizations on the first and on the second substrate are not interconnected in an electrically conductive manner. This electrically conductive connection is achieved in that the first substrate is thinned to such an extent that the viahole is open at the back, whereupon insulating layers on top of the metallization of the second substrate are removed through the viahole so that the metallizations on the first and second substrates are connected in an electrically conductive manner by filling the viahole with a conductive material.

SUMMARY OF THE INVENTION

It is the object of the present invention to provide a method for vertically integrating active circuit planes which permits a substantial simplification of process control.

This object is achieved by a method for vertically integrating active circuit planes in the case of which a first substrate comprising at least one integrated circuit in a first main surface thereof and further comprising connecting areas for the integrated circuit as well as outer connecting areas on the first main surface is provided in a first step. In addition, a second substrate comprising at least one integrated circuit in a first main surface thereof and further comprising connecting areas for the integrated circuit as well as open or openable areas on the first main surface thereof is provided. The first main surfaces of the first and second substrates are joined in such a way that the connecting areas of the first substrate are connected to those of the second substrate in an electrically conductive manner in such a way that the outer connecting areas of the first substrate are in alignment with the open or openable areas of the second substrate. Subsequently, the second substrate is thinned and the outer connecting areas are exposed through the open or openable areas.

The present invention is preferably so conceived that the first and the second substrate are a first and a second wafer, each comprising a plurality of integrated circuits arranged in the first main surface thereof and connecting areas arranged on the first main surface and associated with the respective integrated circuits. The first main surface of the first substrate or first wafer may have provided thereon outer connecting areas which, after the joining of the first and second substrates or first and second wafers, are arranged in such a relation to open areas in the second substrate or second wafer that they are accessible through the open areas in the second substrate or second wafer. It follows that, when the second substrate has been thinned back, external contacting of outer connections of the integrated circuit arranged in the first substrate or wafer can be achieved.

When the first and the second substrate are a first and a second wafer, a dicing step is carried out, when the method according to the present invention has been executed, so as to divide the multi-layer structure produced into a plurality of vertically integrated circuits or multichip modules which are each defined by two interconnected integrated circuits.

The present invention additionally provides a vertically integrated circuit comprising a first integrated circuit in a first main surface of a first substrate, connecting areas for the first integrated circuit on the first main surface of the first substrate, a second integrated circuit in a first main surface of a second substrate, and connecting areas for the second integrated circuit on the first main surface of the second substrate. The first main surfaces of the first and second substrates are joined in such a way that the connecting areas for the first integrated circuit are connected to the connecting areas for the second integrated circuit in an electrically conductive manner.

According to the present invention the main surfaces of the first and second substrates, in which the integrated circuits are formed, are connected to one another. Hence, only extremely short connections are required from one circuit plane to the next; these extremely short connections permit higher system speeds and they help to minimize the dissipation power. According to the present invention, the individual circuit planes are preferably processed as wafers independently of one another, the individual wafers being joined only towards the end of the sequence of production steps. This has the effect that the joining of the two wafers, which have been processed independently of one another, necessitates only a small number of additional steps, for the individual wafer. A high yield can therefore be achieved according to the present invention. In addition, the individual planes can be produced in different technologies, e.g. CMOS bipolar, high-voltage standard CMOS, low-voltage standard CMOS or SOI standard CMOS (SOI=silicon on insulator). The use of highly complex universal technologies is therefore not necessary.

The utilization of the third dimension in the case of integrated circuits opens up a great variety of fields of application. The integration density can be increased, which means that space can be saved. Concrete fields of application are the hardware realization of coding methods, compression methods and data reduction methods in the field of telecommunications or of real-time image processing methods. The present invention is particularly suitable for portable systems, e.g. mobile phones, or for safety systems making use of the so-called cryptotechnology. In the case of the latter, individual circuit elements are distributed over the various planes so that, if the circuit planes are opened later on, the circuit function will no longer be identifiable. It is therefore clearly evident that the present invention can be used advantageously in great number of fields.

BRIEF DESCRIPTION OF THE DRAWINGS

In the following preferred embodiments of the present invention will be explained in detail making reference to the drawings enclosed in which identical elements are designated by identical reference numerals and in which.

DESCRIPTION OF PREFERRED
EMBODIMENTS OF THE INVENTION

Figure 1:
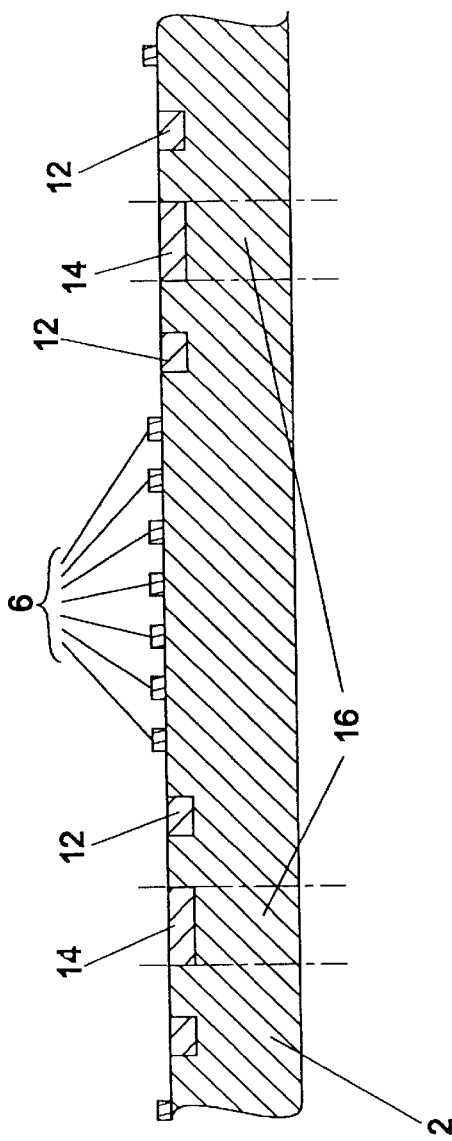
FIGS. 1a) and 1b) show schematic cross-sectional views of a first and of a second substrate used in the method according to the present invention.
Figure 1:
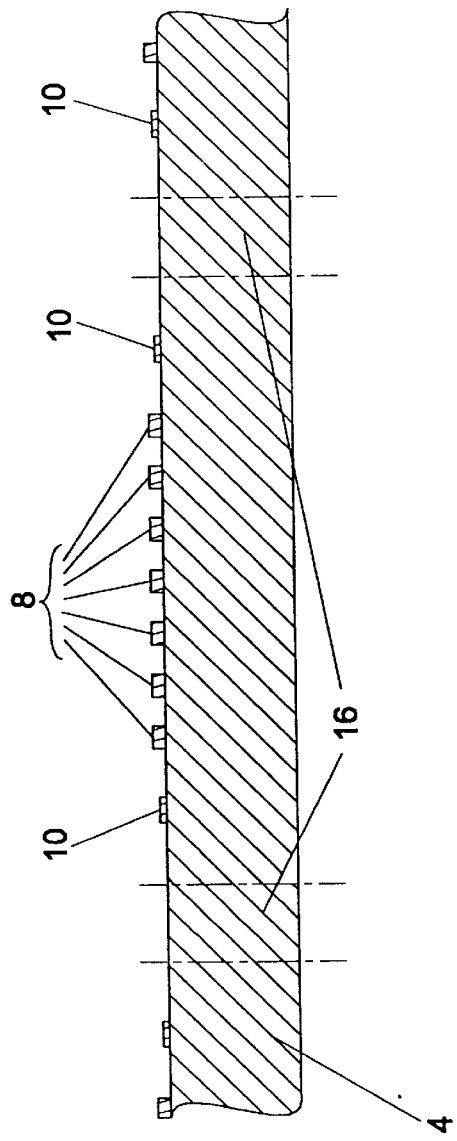

According to preferred embodiments of the present invention, two wafers are produced by identical or different standard production methods. In FIGS. 1a) and 1b) schematic cross-sectional views of two such wafers are shown, the wafer 2 shown in FIG. 1a) being referred to as upper wafer in the following, whereas the wafer 4 shown in FIG. 1b) will be referred to as lower wafer in the following.

The upper wafer 2 is provided with a plurality of connecting areas 6 which will be referred to as inner connecting areas in the following, since they are intended to be used for establishing a direct connection to inner connecting areas 8 of the lower wafer 4. The respective connecting areas 6 and 8 are arranged above integrated circuits (not shown) formed in the wafers 2 and 4. The integrated circuits are so to speak located in the upper main surfaces of the two wafers, i.e. for example in a thickness range of less than 2 μm below the upper main surface. The lower wafer 4 is additionally provided with outer connecting areas 10 which are arranged on the upper surface thereof; these connecting areas can also be seen in the top view of FIG. 2b). The upper wafer 2, however, is provided with recesses 12 in the area in which the lower wafer 4 is provided with the connecting areas 10; in the embodiment shown, these recesses 12; are filled with a polymer. Furthermore, the upper wafer is provided with recesses 14 which are formed in the area of future saw paths 16 for dicing multi-layer modules. In the embodiment shown also the recesses 14 are filled with a polymer. The individual chips 18 are already defined by the recesses 14 in this upper wafer 2. Also in the top view of FIG. 2b), the future saw paths 16 are already schematically shown so that the structure of the individual chips 18 can also be seen in this figure.

The recesses 12 and 14 are formed e.g. by means of conventional deep etching processes in the upper surface of the upper wafer 2. The depth of the etchings corresponds approximately to the future thickness of the upper wafer 2 when this upper wafer has been subjected to thinning, as will be explained in detail in the following with respect to FIG. 3b). A polymer is then preferably introduced into these etchings, as has been explained above.

Figure 2:
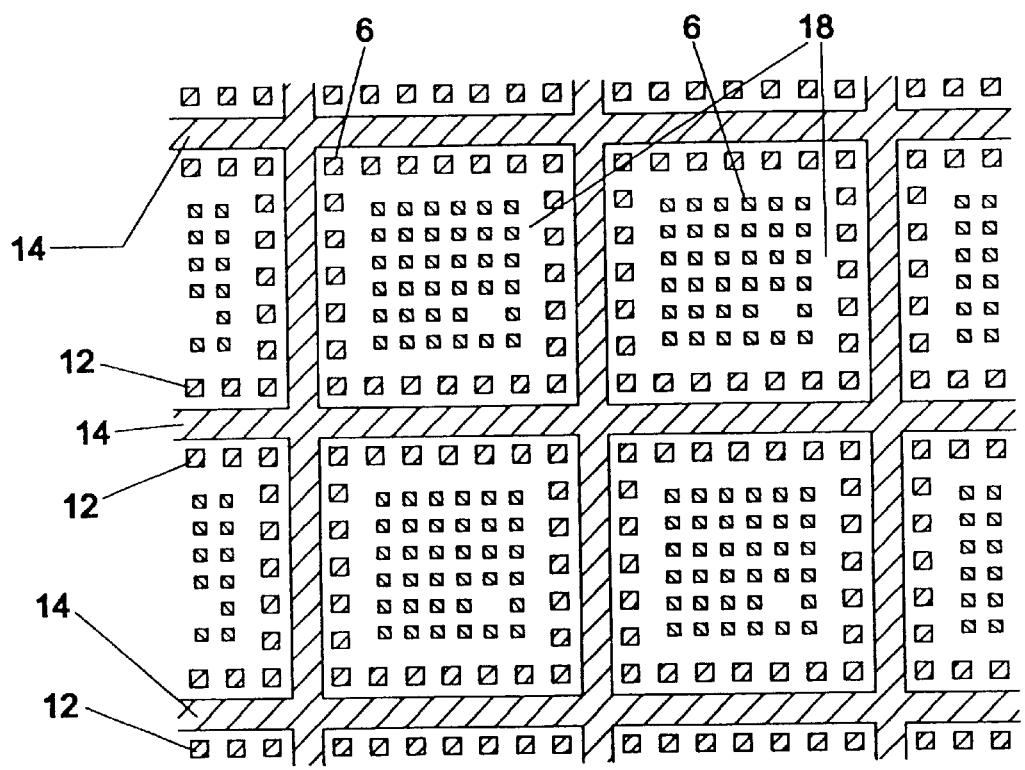
FIGS. 2a) and 2b) show schematic top views of the first and of the second substrate according to FIG. 1a) and 1b)
Figure 2:
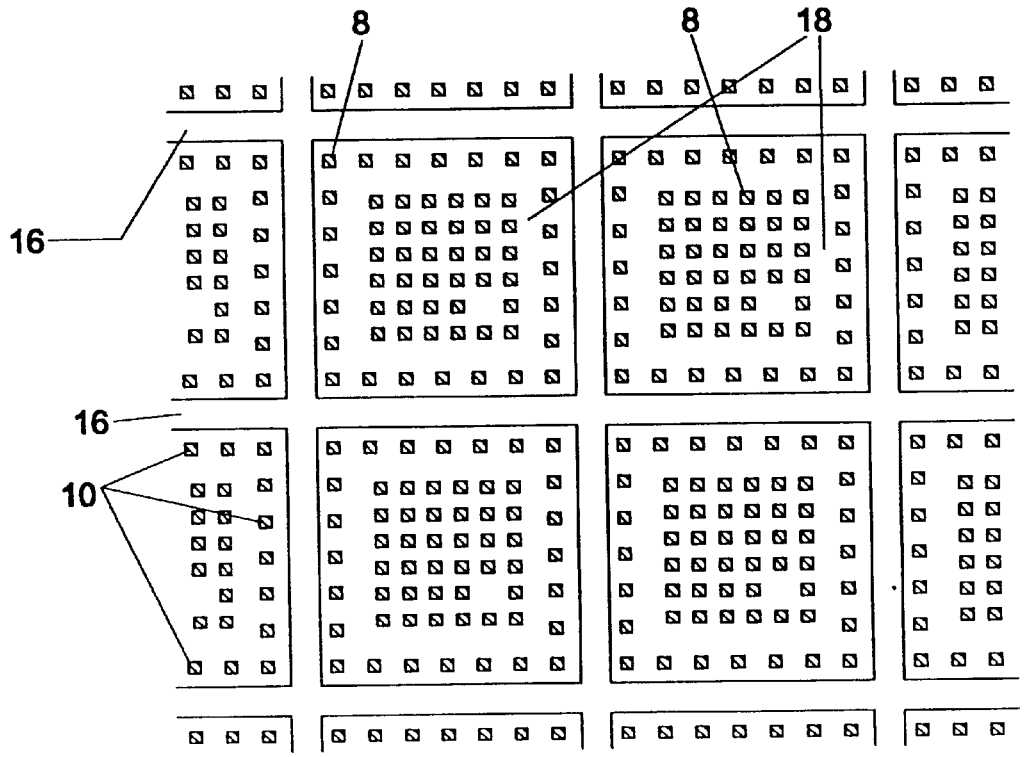

As can especially be seen from the top views of FIG. 2a) and 2b), the individual chips 18, which are still present in a connected wafer arrangement, are identical in area and they are provided with mirror-inverted matching inner connecting areas 6 and 8 whose position on the chip surface can be selected freely. These inner connecting areas 6 and 8 are used later on for establishing the electric connections between the two planes defined by the upper and the lower wafer. The upper and the lower wafer, which are shown in FIG. 1a) and 1b), are then joined in accordance with the present invention so as to form a multi-layer structure.

Figure 3A:
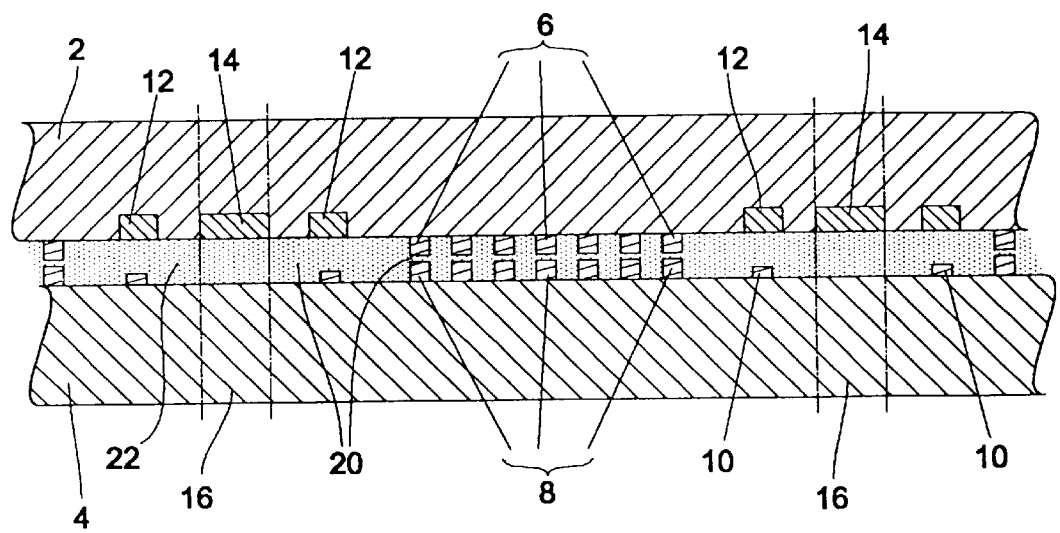
FIGS. 3a) to 3c) show schematic cross-sectional views for illustrating the production steps of one embodiment of the method according to the present invention.
Figure 3B:
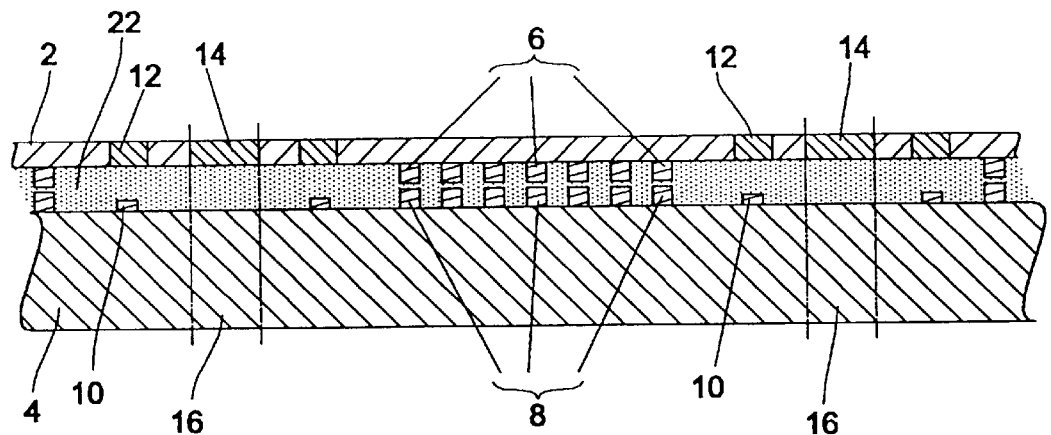

FIG. 3a) shows the two wafers 2 and 4 after they have been joined. For this purpose, the wafers 2 and 4 are adjusted relative to one another in such a way that the respective surfaces thereof, on which the inner connecting areas 6 and 8 are formed, are arranged in opposed relationship with one another. As can be seen in FIG. 3a), the inner connecting areas 6 of the upper wafer 2 are aligned with the inner connecting areas 8 of the lower wafer 4. At this position the two wafers are connected mechanically and electrically, whereby the inner connecting areas 6 of the upper wafer 2 will be connected in an electrically conductive manner to the inner connecting areas 8 of the lower wafer 4.

For connecting the two wafers both mechanically and electrically, a large number of methods, most of then known from the field of flip-chip technology, can be used, e.g. thermocompression bonding, alloying, soldering or joining by means of an adhesive. A preferred form is the use of an adhesive, since this will produce a full-area connection, whereas in the case of the other methods it will still be necessary to fill the gap with a so-called underfiller. When an adhesive is used, two variants can be differentiated. On the one hand, a non-conductive adhesive can be used, the electric contact between the inner connecting areas 6 and 8 being then established by means of a direct contact of the connecting areas which is maintained by the adhesive matrix.

In the embodiment of the method according to the present invention shown in FIGS. 3a) to 3c), an anisotropic conductive adhesive 22 has, however, been used, in the case of which the electric contact between two opposed connecting areas 6 and 8 is established via small conductive balls 20 which are arranged in the adhesive. It will be advantageous to take care that, when joining the wafers by means of an adhesive, the joint should be as uniform and as thin as possible, which means that the bump height of the connecting areas will be reduced to a large extent. When the two wafers 2 and 4 have been joined by means of an adhesive, the structure shown in FIG. 3a) is obtained.

Taking this structure as a basis, the upper wafer 2 is thinned from its main surface, which is located in opposed relationship with the main surface having the connecting areas 6 arranged thereon, in the case of the embodiment shown. The upper wafer can e.g. be thinned to a residual thickness of $\leq 50$ µm. As has already been explained hereinbefore, the recesses 12 and 14 in the upper wafer 2 preferably have a depth which corresponds to the thickness of the upper wafer 2 after thinning of this wafer. In this way, the structure shown in FIG. 3b) is obtained after the thinning; in this structure, the polymer-filled recesses or, to be exact, openings 12 and 14 fully extend through the upper wafer 2. The recesses 12 and 14, which are filled with polymer at this stage of the proceedings, are necessary so that the position of the individual chips 18, FIG. 2a) and 2b), can remain identifiable and so that an accessibility to the outer connecting areas 10 on the lower wafer 4 can additionally be realized later on.

The fact that the recesses 12 and 14 are filled facilitates the thinning of the upper wafer 2. It has already been explained that, depending on the residual thickness of the upper wafer 2 and depending on the wafer connection process used, the recesses in the upper wafer can be filled with a polymer in such a way that they are flush with the surface; alternatively, the adhesive 22 provided as connection element can also be used for filling the recesses.

Figure 3C:
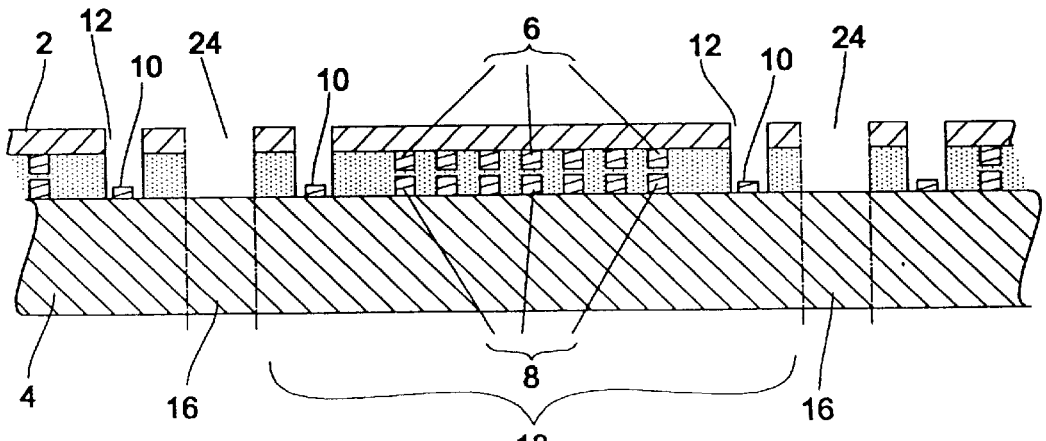

When the upper wafer 2 has been thinned in this way, the polymer filling is removed from the recesses 12 and 14 in accordance with the preferred embodiment according to the present invention and also the adhesive arranged below these polymer fillings of recesses 12 and 14 is removed. On the basis of these steps, the structure shown in FIG. 3c) is obtained. As can be seen, the outer connecting areas 10 of the lower wafer 4 are accessible through the now open recesses 12 in the upper wafer 2. When executing the above-mentioned process of removing the polymer from the recesses 12 and of eliminating the underlying adhesive, the polymer contained in recesses 14 and the underlying adhesive can be removed simultaneously so that the openings 24 shown in FIG. 3c) are obtained. Along the resultant openings 24 the dicing step will be carried out later on so as to produce individual chip modules. The structural design shown in FIG. 3c) can be subjected to further processing like a conventional standard wafer, i.e. it can e.g. subjected to dicing by means of suitable diamond saws or the like. Alternatively to the embodiment shown, it is also possible to subject the lower wafer 4 to thinning, if the total thickness of the module to be produced should be very thin. The thinning of the upper and lower wafers 2 and 4 can be carried out by means of conventional techniques, such as grinding, etching polishing, and the like.

After dicing along the saw paths 16, the chip modules 18 according to the present invention are obtained, which comprise two integrated circuits arranged in different substrates. The two substrates are interconnected in such a way that the surfaces thereof, in which the respective integrated circuits are formed, face each other. Furthermore, very short connection paths can be realized due to the fact that the connecting areas of the respective integrated circuits are connected directly.

Figure 4:
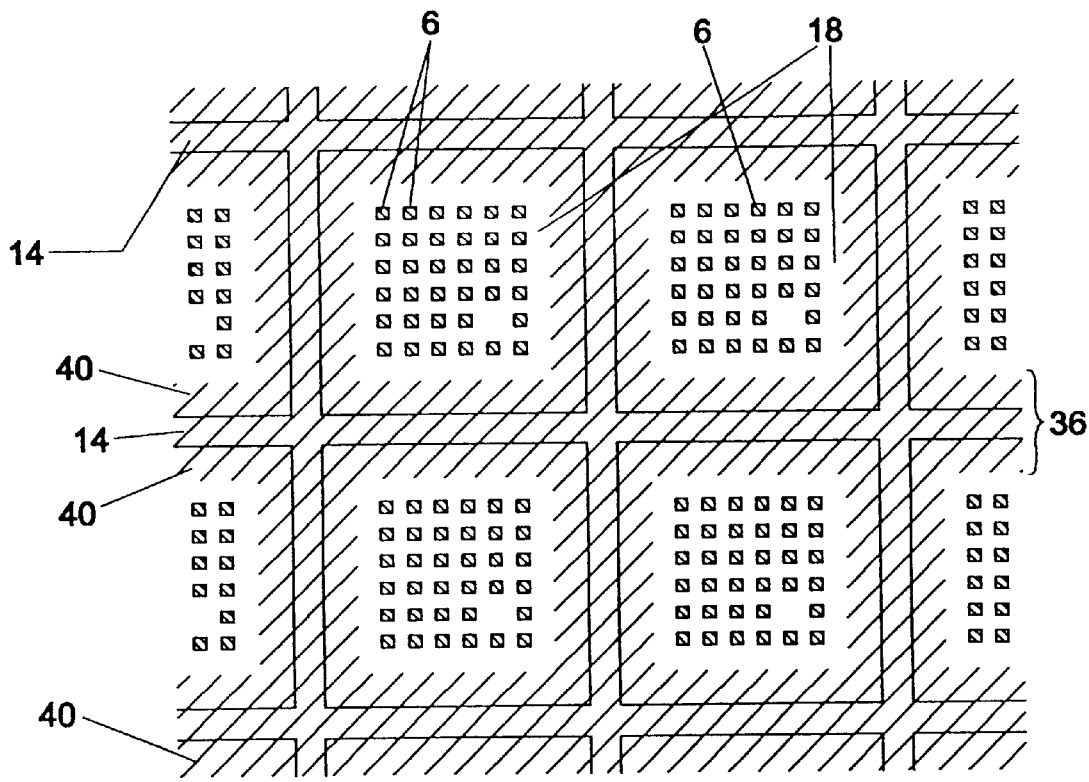
FIG. 4 shows a schematic top view of an alternative embodiment of a substrate which is to be used for the method according to the present invention.
Figure 5:
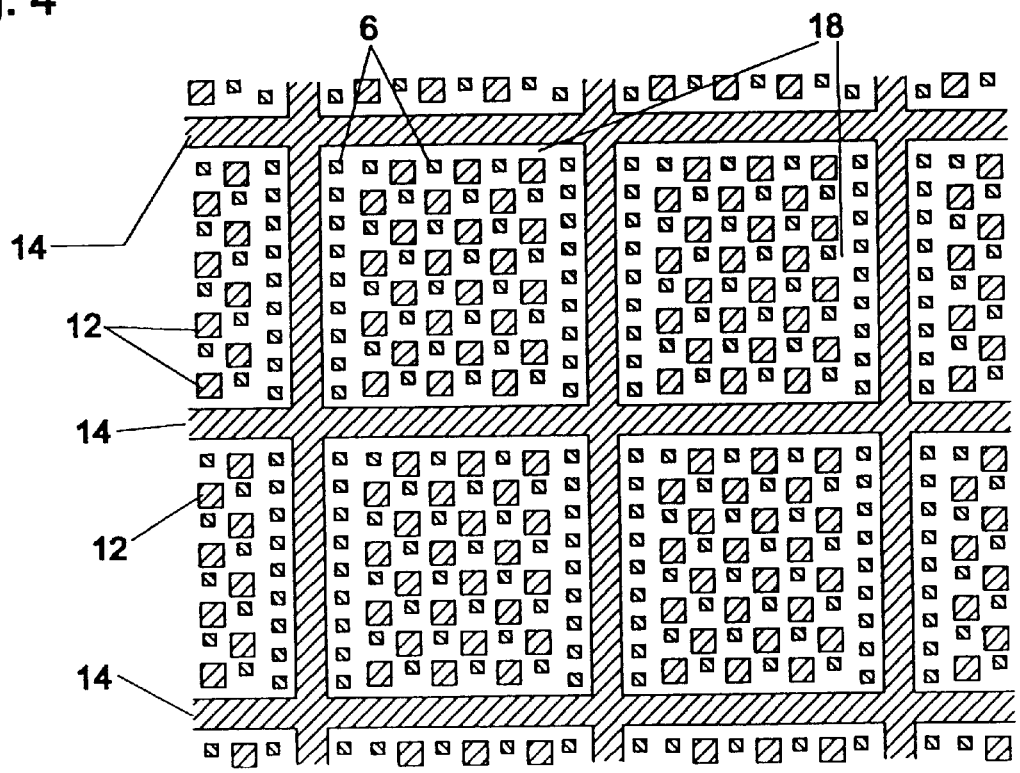
FIG. 5 shows a schematic top view of a further alternative embodiment of a substrate which is to be used for the method according to the present invention.

FIG. 4 shows a schematic top view of an alternative embodiment of the above wafer. Other than in the case of the above-described embodiment, the embodiment shown in FIG. 4 is not provided with individually produced recesses 12 for the outer connecting areas 10 of the lower wafer, but a broad frame 36 is provided, which comprises saw paths 14 and recesses 40 for outer connecting areas 10 along the individual chips 18. This arrangement necessitates in any case that the outer connecting areas 10 are arranged on the lower wafer 4 along the edge of the individual chips. An alternative arrangement of the inner connecting areas 6 and of the recesses 12 for the outer connecting areas on the second wafer is shown in FIG. 5. The inner connecting areas 6 and the recesses 12 are in this case arranged substantially alternately within the respective chips 18. It is, however, apparent that arbitrary arrangements of inner connecting areas and recesses for the outer connecting areas on the first wafer are possible as long as a mirror-inverted corresponding arrangement of the recesses 12 and of the outer connecting areas 10 is provided on the lower wafer 4.

The present invention provides a large number of advantages. By means of the layer structure very high integration densities are achieved, an extremely thin thickness of the overall structure being, however, still possible. Due to the extremely short connections between the circuit planes, it is, additionally, possible to realize circuit modules which can be operated at very high frequencies and with a very low driving power. In addition, standard processes will largely suffice to execute the methods according to the present invention. The wafer or the wafers can be thinned without using auxiliary supports. Finally, the wafers can be connected without any high-temperature steps being necessary. It follows that the present invention provides an extremely economical method for producing VLSI circuits and, due to a low reject rate and the simple production method, economy-priced multichip modules.

The chips produced according to the present invention can be further processed by means of standard methods.

What is claimed is:

1. A method for vertically integrating active circuit planes, comprising the following steps:
   providing a first substrate comprising at least one integrated circuit in a first main surface thereof and further comprising connecting areas for the integrated circuit as well as outer connecting areas on said first main surface;
   providing a second substrate comprising at least one integrated circuit in a first main surface thereof and further comprising connecting areas for the integrated circuit as well as open or openable areas on said first main surface;
   joining the first main surfaces of said first and second substrates in such a way that the connecting areas of the first substrate are connected to those of the second substrate in an electrically conductive manner, and in such a way that the outer connecting areas of the first substrate are in alignment with the open or openable areas of the second substrate;
   thinning the second substrate; and
   exposing the outer connecting areas through the open or openable areas.

2. A method according to claim 1, wherein said first and second substrates are joined in such a way that the connecting areas on said first and second substrates are in alignment with one another.

3. A method according to claim 1, wherein said second substrate has open areas provided therein so that, when said second substrate has been thinned, the outer connecting areas are accessible through the second substrate.

4. A method according to claim 1, wherein the second substrate has provided therein openable areas, said openable areas being opened after the thinning of the second substrate, so that the outer connecting areas will be accessible through said second substrate.

5. A method according to claim 1, wherein said first and second substrates are joined by means of an adhesive, the parts of the adhesive covering the outer connecting areas being removed through the open areas of the second substrate.

6. A method according to claim 1, wherein said second substrate is thinned from the second main surface thereof, which is opposed to the first main surface, in such a way that the open or openable areas fully penetrate the second substrate.

7. A method according to claim 1, wherein the first and the second substrate are a first and a second wafer, each of said wafers having a plurality of integrated circuits in the first main surface thereof and respective associated connecting areas on said first main surface.

8. A method according to claim 7, wherein the second wafer is provided with open or openable separation grooves defining positions for saw paths for dicing the respective connected integrated circuits in said first and second wafers.

9. A method according to claim 8, wherein said separation grooves fully penetrate the second wafer after the thinning of said second wafer.

10. A method for producing multichip modules according to claim 7, further comprising the step of dicing the multichip structure so as to obtain a plurality of multichip modules.

* * * * *